(12) United States Patent
Joachim et al.

(10) Patent No.: US 6,687,150 B1
(45) Date of Patent: Feb. 3, 2004

(54) REFERENCE VOLTAGE GENERATION FOR MEMORY CIRCUITS

(75) Inventors: Hans-Oliver Joachim, Zushi (JP); Takashima Daisaburo, Tokyo (JP)

(73) Assignees: Infineon Technologies Aktiengesellschaft, Munich (DE); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/064,955

(22) Filed: Sep. 4, 2002

(65) Prior Publication Data
(65)

(51) Int. Cl.[7] .......................... G11C 11/22; G11C 11/24
(52) U.S. Cl. .................. 365/145; 365/149; 365/210
(58) Field of Search ................. 365/145, 149, 365/189.07, 189.09, 210

(56) References Cited

U.S. PATENT DOCUMENTS 6,246,621 B1 * 6/2001 Miyamoto ............... 365/210
6,333,870 B1 * 12/2001 Kang ....................... 365/145

FOREIGN PATENT DOCUMENTS

JP          10209387 A  *  4/2002

* cited by examiner

*Primary Examiner*—Son Mai
(74) *Attorney, Agent, or Firm*—Horizon IP Pte Ltd

(57) ABSTRACT

An improved reference voltage generation is described. In one embodiment, a memory block includes a plurality of memory cells interconnected by wordlines and bitlines. A plurality of reference cells are provided. A bitline includes a reference cell. The bitlines of the memory block are divided into groups or bitlines. The reference cells within a group are interconnected to average out the reference cell charge variation to improve the sensing window.

27 Claims, 5 Drawing Sheets

REFERENCE VOLTAGE GENERATION FOR MEMORY CIRCUITS

BACKGROUND OF INVENTION

Ferroelectric metal oxide ceramic materials such as lead zirconate titanate (PZT) have been investigated for use in ferroelectric semi conductor memory devices. FIG. 1 shows a conventional ferroelectric memory cell 105 having a transistor 130 and a ferroelectric capacitor 140. A capacitor electrode 142 is coupled to a plateline 170 and another capacitor electrode 141 is coupled to the transistor which selectively couples or decouples the capacitor from a bitline 150, depending on the state (active or inactive) of a wordline 160 coupled to the transistor gate. A plurality of memory cells are interconnected via wordlines and bitlines to form an array. Sense amplifiers are coupled to the bitlines to access the memory cell.

Information is stored in the capacitor as remanent polarization. When a memory cell is read, a read signal is produced on the bitline. The read signal voltage is either $V_{HI}$ or $V_{LO}$, depending on whether a logic 1 or logic 0 is stored in the memory cell. The read signal is compared with a reference voltage by the sense amplifier and amplified. The reference voltage is set to a level between $V_{LO}$ and $V_{HI}$ (sensing window). Typically, $V_{LO}$ is about 0.6V and $V_{HI}$ is about 1.2V for ICs with operating voltages of about 2.5V.

The reference voltage can be generated through the use of a reference cell scheme. Typically, a reference cell is provided for each bitline and pre-biased to produce the reference voltage. A reference cell is similar to a memory cell except that it is coupled to a reference wordline and a reference plateline. Pre-biasing is performed by, for example, writing a "0" to the reference cell to produce the reference charge which is subsequently shared with the opposite BL from that receiving the cell signal (e.g., non-switching read of "0"). The size of the reference cell should be chosen to produce a higher cell capacitance compared to the regular memory cell. This is because the reference signal ("0" signal of the reference cell) should be between the "0" and "1" signals of the actual memory cell.

The read signal is compared with the reference voltage produced by the reference cell on the reference bitline. Generally, the read signals are distributed over a voltage range (distribution), as shown in FIG. 2. This may be due to various reasons, such as process variations or difference in bitline capacitances experienced by different cells. The reference voltage 266 is selected to be between the logic 0 and logic 1 read signal distributions 204 and 206 to provide the optimum sensing window 294.

Like the memory cells of the array, the charge generated by the reference cells will also be distributed within a range 268. Having a reference signal distribution effectively reduces the sensing window. For example, the logic 1 signal sensing window 296 is effectively reduced to between the end of the reference cell;distribution and beginning of the logic 1read signal distribution (298). This may cause failures in sensing, particularly with future designs having smaller sensing window due to a reduction in operating voltages.

To reduce the variations between the different reference cells, the reference cells. $314_0$–$314_{n-1}$ of an array having n number of bitlines $BL_0$–$BL_{n-1}$ are interconnected by a conductive line 378 between the reference cell transistor 374 and capacitor 376, as shown in FIG. 3. Interconnecting all the reference cells in the array is described in, for example, Kang et al., "A Pulse-Tuned Charge Controlling Scheme for Uniform Main and Reference Bitline Voltage Generation on 1T1C FeRAM", Symp on VLSI Circuits Digest, p. 125, June 2001, which is herein incorporated by reference for all purposes. However, in such a scheme, a failure in one reference cell would result in failure of the whole array.

From the foregoing discussion, it is desirable to provide an improved reference cell scheme which reduces the distribution of reference cell charge.

SUMMARY OF INVENTION

The invention relates to memory integrated circuits (ICs), and more particularly, to reference voltage generation in memory ICs. In one embodiment, the memory IC includes a memory block having a plurality of memory cells. The memory cells are interconnected in a first direction by wordlines and bitlines in a second direction. A plurality of memory cells are provided for the memory block. A bitline includes a reference cell. In one embodiment, the bitlines of the memory block are separated into groups, wherein at least some of the reference cells within a group are interconnected to average out the reference cell charge variations. Averaging out the reference cell charge variations produces a narrower reference voltage distribution, which increases the sensing window. This improves reliability and increases manufacturing yield.

DETAILED DESCRIPTION

Figure 1:
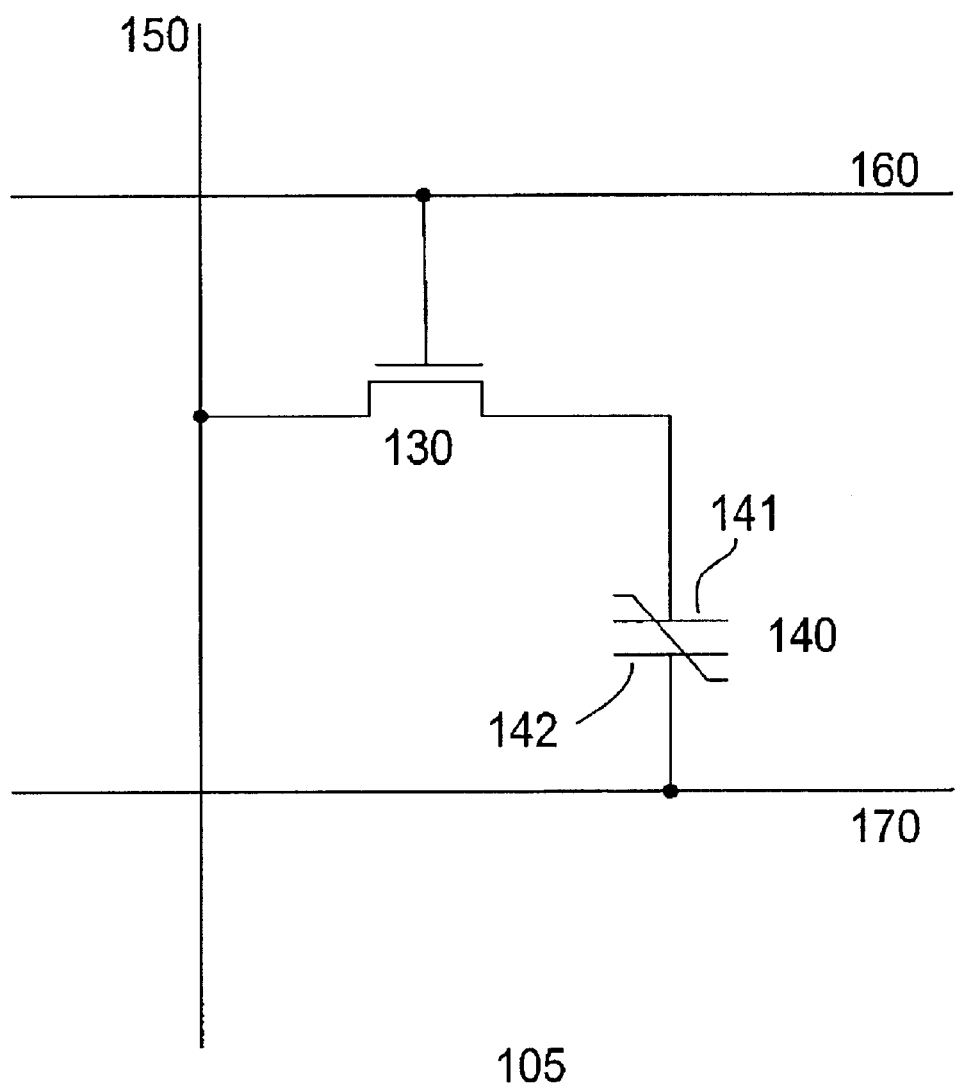
FIG. 1 shows a conventional ferroelectric capacitor.
Figure 4:
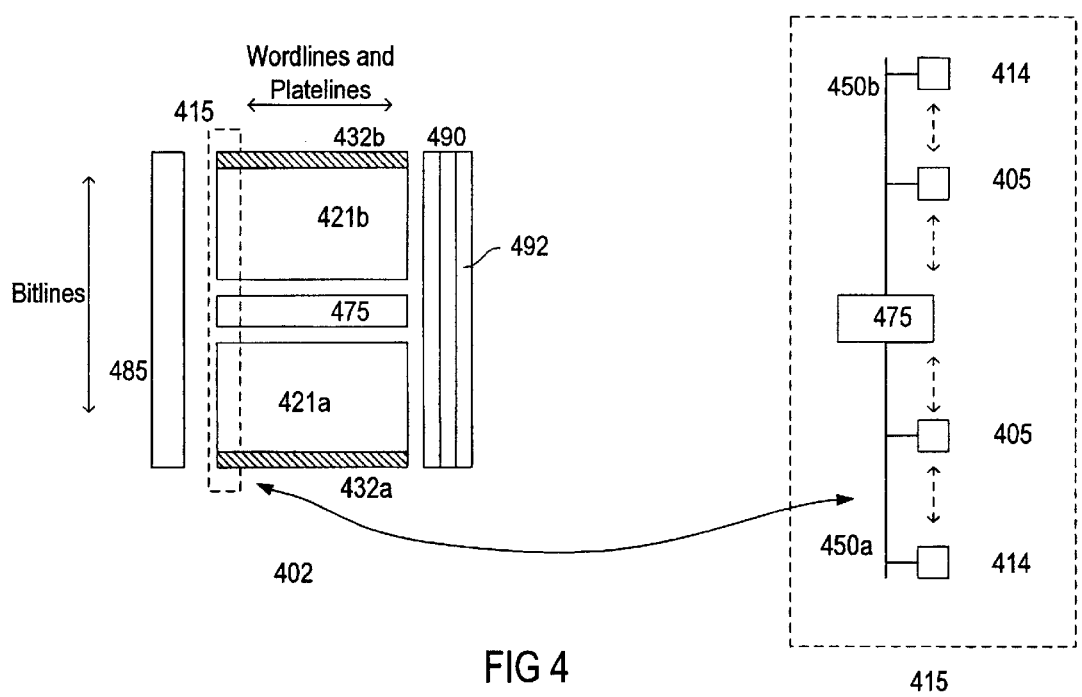
FIG. 4 shows a reference cell scheme in accordance with one embodiment of the invention.

The present invention relates to ferroelectric memory ICs with improved reference cell scheme. FIG. 4 shows one embodiment of the invention. As shown, a memory array 402 is shown. The memory array comprises a plurality of ferroelectric memory cells, such as those shown in FIG. 1, interconnected by wordlines, bitlines and platelines. Wordlines and platelines are in a first direction while bitlines are in a second direction. In one embodiment, the memory array includes first and second blocks 421a–b. Other number of memory blocks can also be useful. A bank 475 of sense amplifier (SA bank) is located between the blocks along the direction of the wordlines and platelines. The bitlines of the blocks are coupled to the sense amplifiers of the SA bank. Row decoders 485 are located on a side of the blocks along the direction of the bitlines. The row decoders include, for example, wordline and plateline drivers.

In one embodiment, reference cells are coupled to one end of the bitlines, creating a reference cell region 432 of the block. The reference cells are located, for example, on the ends of the bitline opposite the end coupled to the SA bank. Providing reference cells on the opposite end or other portions of the bitlines are also useful.

A pair of bitlines are coupled to a sense amplifier in the SA bank, forming a column 415. A cell is selected from one of the bitlines of the bitline pair. The selected cell produces a read signal on its respective bitline. The other bitline of the bitline pair serves as a reference bitline. The reference cell on the reference bitline produces a reference voltage. The read signal is compared with the reference voltage on the reference bitline.

In one embodiment, the memory cells of the array are arranged in an open bitline architecture. A column 415 of the array is depicted in greater detail. The column includes a pair of bitlines 450a and 450b, one from each of the memory blocks 421a and 421b. Each bitline comprises a plurality of memory cells 405 and one reference cell 414. Providing more than one reference cell per bitline is also useful. The memory array can be arranged in other types of architectures, such as folded bitline architectures. In a folded architecture, the bitlines of a bitline pair are from the same memory block. Other architectures, such as series architectures, are also useful. Series architectures, are described in, for example, Takashima et al., "High Density Chain ferroelectric random access Memory (chain FRAM)", IEEE Jrnl. of Solid State Circuits, vol.33, pp.787–792, May 1998, which is herein incorporated by reference for all purposes.

In processing of the IC, defects occur which render memory cells inoperable. To improve yield, a redundant block 490 of memory cells is provided. The redundant block includes one or more redundant elements 492. The redundant block is shown as a separate unit of the memory block for purposes of discussion. It is understood that the redundant block need not necessarily be separate from the memory blocks. In one embodiment, a redundant element comprises a plurality of bitlines. The redundant element is facilitates, for example, column redundancy. The number of bitlines, for example, is between 2–8. Redundant elements of other sizes are also useful. Generally, the redundant elements have the same number of bitlines. Providing redundant elements with different number of bitlines are also useful. The number of bitlines in a redundant element can be selected to accommodate design needs.

In one embodiment, the memory array is separated into redundant units, each replaceable by a redundant element. If one or more defective cells occur in a redundant unit of the memory array, the defective redundant unit can be repaired by replacing it with a redundant element. The number of defective redundant units that can be repaired is equal to the number of redundant elements in the redundant block. Redundancy can be effected through conventional techniques, such as fuses.

In accordance with one embodiment of the invention, at least some of the reference cells within a redundant unit of the memory array are interconnected to average out reference cell charge variations. Preferably, all the reference cells within a redundant unit are interconnected.

Figure 2:
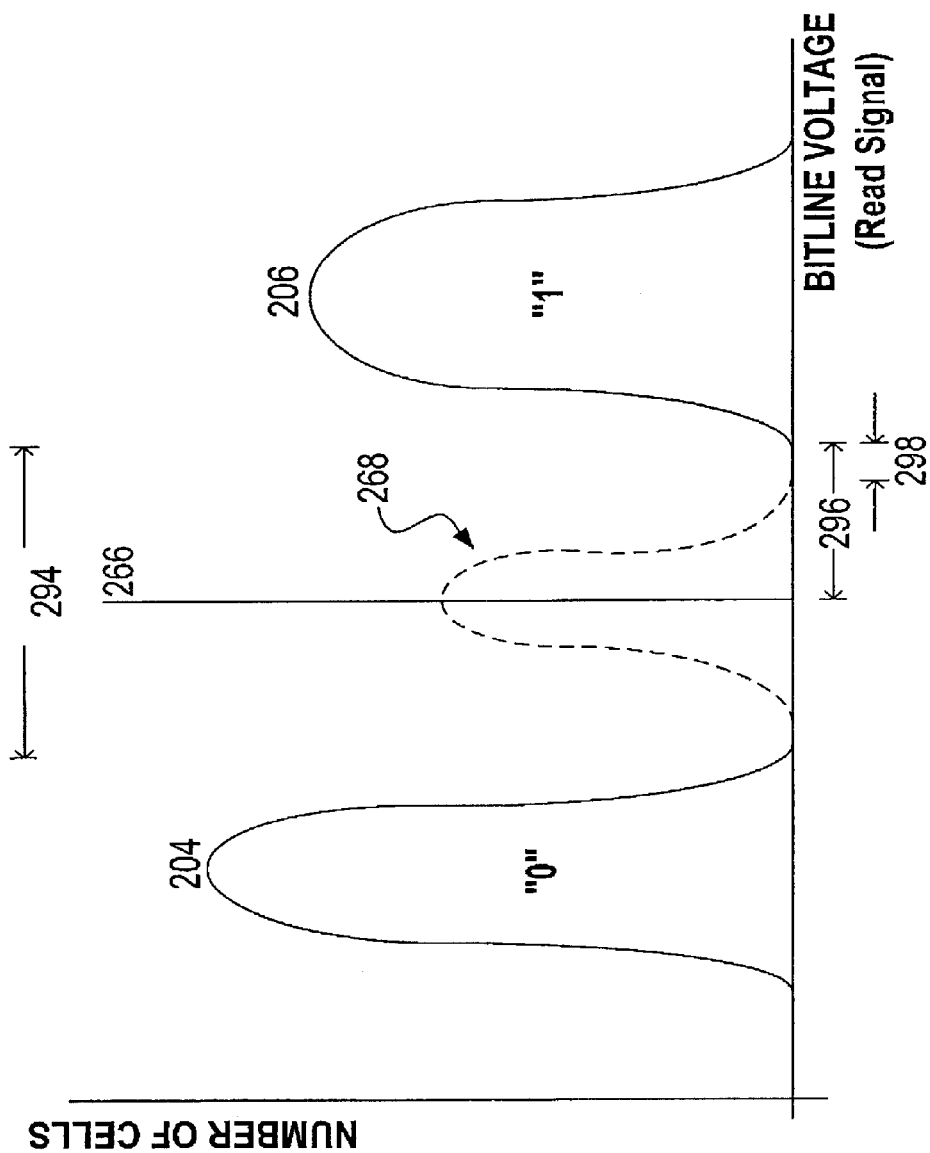
FIG. 2 shows read signal distributions in a conventional ferroelectric memory array.
Figure 3:
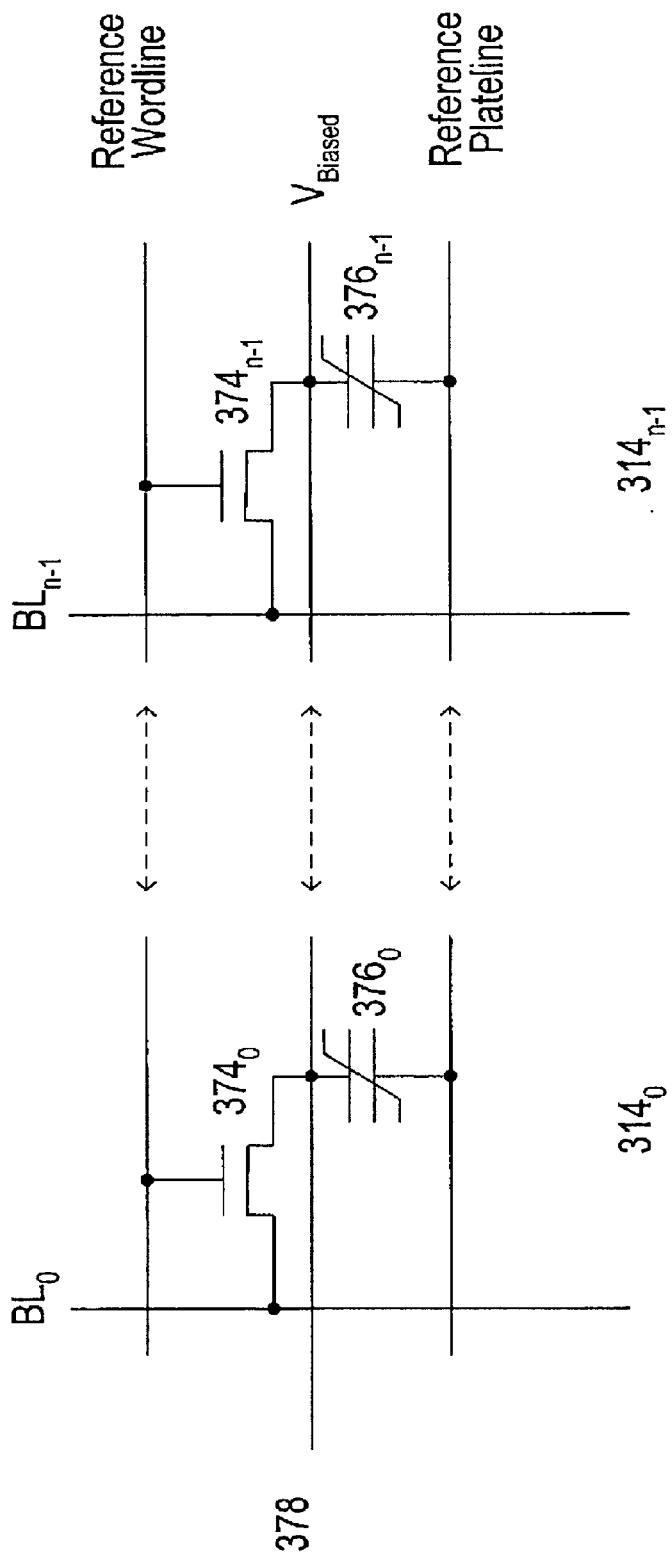
FIG. 3 shows a conventional reference cell scheme.
Figure 5:
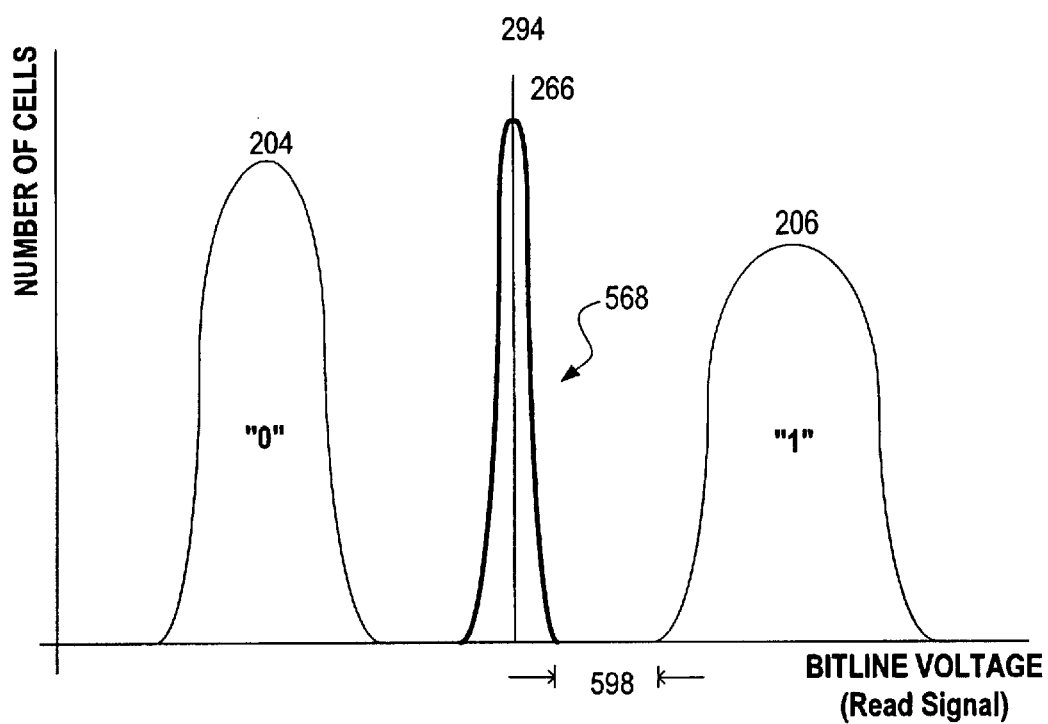
FIG. 5 shows a reference cell distribution in accordance with one embodiment of the invention.

As described, the present invention enables averaging out of reference cell distribution without the adverse impact of conventional reference cell schemes. FIG. 5 shows a reference cell distribution in accordance with one embodiment of the invention. As shown, the reference cell distribution 568 is more narrow compared to conventional reference cell schemes of FIG. 2. Narrowing of the reference cell distribution results in a larger sensing window (e.g., 298 for logic 1 read signals).

Additionally, by only interconnecting the reference cells within a redundancy unit, one or more defective redundant cells would not adversely impact the whole array. Moreover, the defective redundant cell or cells in the redundancy unit can be repaired with a redundancy element.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:
   a memory block having a plurality of memory cells;
   wordlines coupling memory cells in a second direction;
   bitlines coupling memory cells in a first direction;
   a plurality of reference cells, wherein a bitline includes a reference memory cell; and
   the bitlines of the memory block are divided into groups of bitlines, wherein at least some of the reference cells within a group are interconnected to average out the reference cell charge variations.

2. The integrated circuit of claim 1 wherein the memory cells are arranged in a series architecture.

3. The integrated circuit of claim 1 wherein the memory cells are arranged in a folded bitline architecture.

4. The integrated circuit of claim 1 wherein the memory cells are arranged in an open bitline architecture.

5. The integrated circuit of claim 1 wherein the memory cells are ferroelectric memory cells.

6. The integrated circuit of claim 5 wherein the memory cells are arranged in a series architecture.

7. The integrated circuit of claim 5 wherein the memory cells are arranged in a folded bitline architecture.

8. The integrated circuit of claim 5 wherein the memory cells are arranged in an open bitline architecture.

9. The integrated circuit of claim 1 or 5 wherein the reference memory cells within a group are interconnected.

10. The integrated circuit of claim 9 wherein the interconnected reference cells are interconnected between a capacitor and a transistor of the reference memory cell.

11. The integrated circuit of claim 9 further comprises a redundancy block having at least one redundancy element, wherein a redundant element comprises n redundant bitlines to repair defective bitlines in the memory block, where n is a whole number greater to or equal to 2.

12. The integrated circuit of claim 11 wherein the groups comprise n bitlines.

13. The integrated circuit of claim 12 wherein the interconnected reference cells are interconnected between a capacitor and a transistor of the reference memory cell.

14. The integrated circuit of claim 1 or 5 wherein bitlines of the memory block are formed into columns having first and second bitlines coupled to a sense amplifier.

15. The integrated circuit of claim 14 wherein the interconnected reference cells are interconnected between a capacitor and a transistor of the reference memory cell.

16. The integrated circuit of claim 14 further comprises redundancy block having at least one redundancy element, wherein a redundant element comprises n redundant bitline columns to repair defective bitlines in the memory block, where n is a whole number greater to or equal to 2.

17. The integrated circuit of claim 16 wherein the groups comprise n bitlines.

18. The integrated circuit of claim 17 wherein the interconnected reference cells are interconnected between a capacitor and a transistor of the reference memory cell.

19. The integrated circuit of claim 14 wherein the reference memory cells within a group are interconnected.

20. The integrated circuit of claim 19 wherein the interconnected reference cells are interconnected between a capacitor and a transistor of the reference memory cell.

21. The integrated circuit of claim 19 further comprises redundancy block having at least one redundancy element, wherein a redundant element comprises n redundant bitline columns to repair defective bitlines in the memory block, where n is a whole number greater to or equal to 2.

22. The integrated circuit of claim 21 wherein the groups comprise n columns.

23. The integrated circuit of claim 22 wherein the interconnected reference cells are interconnected between a capacitor and a transistor of the reference memory cell.

24. A method for improved generation of reference signal in integrated circuits comprising:
   providing a memory block having a plurality of memory cells coupled in a first direction by wordlines and coupled in a second direction by bitlines;
   providing a plurality of reference memory cells in the memory block, wherein a bitline includes a reference memory cell; and
   dividing the bitlines of the memory block into groups of bitlines, wherein at least some of the reference cells within a group are interconnected to average out the reference cell charge variations.

25. The method of claim 24 wherein the interconnected reference cells are interconnected between a capacitor and a transistor of the reference memory cell.

26. The method of claim 24 wherein the reference memory cells within a group are interconnected.

27. The method of claim 26 wherein the interconnected reference cells are interconnected between a capacitor and a transistor of the reference memory cell.

* * * * *